(12) United States Patent
Ishizawa et al.

(10) Patent No.: US 6,870,602 B2
(45) Date of Patent: Mar. 22, 2005

(54) METHOD FOR FORMING OPTICAL THIN FILM AND OPTICAL ELEMENT PROVIDED WITH OPTICAL THIN FILM

(75) Inventors: Hitoshi Ishizawa, Kawasaki (JP); Tsuyoshi Murata, Sagamihara (JP)

(73) Assignee: Nikon Corporation, Tokyo (JP)

(*) Notice: Subject to any disclaimer, the term of this patent is extended or adjusted under 35 U.S.C. 154(b) by 0 days.

(21) Appl. No.: 10/208,874

(22) Filed: Aug. 1, 2002

(65) Prior Publication Data

US 2002/0191168 A1 Dec. 19, 2002

Related U.S. Application Data

(63) Continuation of application No. PCT/JP01/07457, filed on Aug. 30, 2001.

(30) Foreign Application Priority Data

Aug. 30, 2000 (JP) ........................................ 2000-260248

(51) Int. Cl.[7] ............................ G03B 27/54; B28B 1/38
(52) U.S. Cl. ........................................ 355/67; 264/307
(58) Field of Search .................. 355/67, 53; 264/307, 264/621; 427/515, 266; 430/14; 438/29; 428/429

(56) References Cited

U.S. PATENT DOCUMENTS

| 5,993,898 | A | | 11/1999 | Nagatsuka |
| 6,342,177 | B1 | * | 1/2002 | Kitaoka ...................... 264/307 |
| 6,376,089 | B1 | * | 4/2002 | Nishiuchi et al. ........... 428/457 |

FOREIGN PATENT DOCUMENTS

| EP | 0 416 119 A1 | 3/1991 |
| JP | A-63-113502 | 5/1988 |
| JP | A 2-264901 | 10/1990 |
| JP | A 5-208811 | 8/1993 |
| JP | A 7-39747 | 2/1995 |
| JP | A 7-326308 | 12/1995 |
| JP | A 10-319209 | 12/1998 |

OTHER PUBLICATIONS

George, "Preparation of Thin Films", Marcel Dekker, Inc., pp. 1–222, 1992.
Flory, "Thin Films for Optical Systems", Marcel Dekker, Inc., pp. 91–247, 1995.
Thomas, "Method for the preparation of porous silica antireflection coatings varying in refractive index from 1.22 to 1.44", Applied Optics, vol. 31, No. 28, pp. 6145–6149, Oct. 1992.
Thomas, "Porous fluoride antireflective coatings", Applied Optics, vol. 27, No. 16, pp. 3356–3358, Aug., 1988.
Brinker et al., "SOL–GEL Science", Academic Press, Inc., pp. 788–797, 1990.
Floch et al., "Optical Coatings Prepared from Colloidal Media", Thin Solid Films, vol. 175, pp. 173–178, 1989.

* cited by examiner

Primary Examiner—Peter B. Kim
(74) Attorney, Agent, or Firm—Oliff & Berridge, PLC (57) ABSTRACT

A method for forming an optical thin film on a substrate comprises the steps of preparing a sol solution containing minute particles for an optical element dispersed in a dispersion medium, putting the prepared sol solution in a tightly closable vessel to heat and pressurize the sol solution, and then applying the heated and pressurized sol solution onto an optical substrate. The obtained thin film has a refractive index of 1.16 with respect to a light beam having a wavelength of 193 nm, in which the transmission loss is not more than 0.5%. An optical lens including the optical thin film formed on the surface, and an exposure apparatus including the lens provided for a projection optical system or an illumination system are provided.

14 Claims, 9 Drawing Sheets

| | MAGNESIUM COMPOUND | AUTOCLAVE TREATMENT TEMPERATURE | AUTOCLAVE TREATMENT PRESSURE (kg/cm²) | REFRACTIVE INDEX | TRANSMISSION LOSS (%) | FILLING RATE (%) |
|---|---|---|---|---|---|---|
| EXAMPLE 1 | MAGNESIUM ACETATE TETRAHYDRATE | 120°C | 7 | 1.271 | 0.12 | 63.2 |
| | | 140°C | 12 | 1.257 | 0.13 | 60.0 |
| | | 160°C | 18 | 1.267 | 0.44 | 62.6 |
| | | 180°C | 28 | 1.265 | 0.45 | 61.9 |
| EXAMPLE 2 | MAGNESIUM METHOXIDE | 120°C | 7 | 1.257 | 0.23 | 60.0 |
| | | 140°C | 12 | 1.263 | 0.17 | 61.4 |
| | | 160°C | 18 | 1.261 | 0.32 | 60.9 |
| | | 180°C | 28 | 1.256 | 0.45 | 59.8 |
| EXAMPLE 3 | ANHYDROUS MAGNESIUM CHLORIDE | 100°C | 4 | 1.279 | 0.18 | 65.1 |
| | | 120°C | 7 | 1.272 | 0.15 | 63.3 |
| | | 140°C | 12 | 1.263 | 0.28 | 61.4 |
| COMPARATIVE EXAMPLE | MAGNESIUM ACETATE TETRAHYDRATE | NO AUTOCLAVE TREATMENT | | 1.352 | 0.18 | 82.2 |

METHOD FOR FORMING OPTICAL THIN FILM AND OPTICAL ELEMENT PROVIDED WITH OPTICAL THIN FILM

CROSS-REFERENCE

This application is a Continuation Application of International Application No. PCT/JP01/07457 which was filed on Aug. 30, 2001 claiming the conventional priority of Japanese patent Application No. 2000-260248 filed on Aug. 30, 2000.

BACKGROUND OF THE INVENTION

1. Field of the Invention

The present invention relates to a method for forming an optical thin film, and an optical element provided with the optical thin film. In particular, the present invention relates to a method for forming an optical thin film having good optical characteristics with respect to a light beam having a short wavelength of not more than 300 nm. The present invention also relates to an optical element which is provided with such an optical thin film, and an exposure apparatus which has such an optical element.

2. Description of the Related Art

A variety of optical thin films are applied to the optical system. The optical thin film is roughly classified into the antireflection film and the reflection film, and they are applied to the surface of the optical element such as lenses and prisms. The antireflection film is applied in order to reduce any unfavorable reflection. The reflection film is applied in order to efficiently reflect an incident light beam on the surface of an optical material so that the light amount is retained with desired optical characteristics.

In general, such an optical thin film is produced by the dry method (dry process). The dry process means the liquid-free process such as the vacuum deposition, the sputtering and CVD (Chemical Vapor Deposition). The method of the dry process is disclosed, for example, in Joy George, Preparation of Thin Films (Marcel Dekker, Inc., New York, 1992) and Francois R. Flory, Thin Films for Optical Systems (Marcel Dekker, Inc., New York, 1995). It is known that in order to obtain a film having high performance such as the wide wavelength band, the wide angular characteristics, and the desired reflection characteristics (low reflectance for the antireflection film and high reflectance for the reflection film), a plurality of coating materials having different refractive indexes may be combined and multilayered. It is also known that the larger the difference in refractive index among the coating materials to be used is, and the lower the minimum refractive index of the coating material to be used is, the more improved the optical performance is. It is also known that the number of coating layers can be decreased by increasing the difference in refractive index among the coating materials to be used and by using the coating material having a low refractive index. As a result, an optical thin film, which has the high performance with respect to the light beam in the visible region, has been obtained.

The ultralarge scale integrated circuit (ULSI) is being progressively highly integrated to have higher function year by year. At present, the printing line width of the semiconductor circuit is extremely fine and minute, i.e., 0.18 $\mu$m. In such circumstances, the high resolution and the deep depth of focus are required for the projection lens to be used for the reduction projection semiconductor exposure apparatus. The resolution and the depth of focus are determined by N.A. (numerical aperture) of the lens and the wavelength of the light beam to be used for the exposure. The finer the pattern is, the larger the angle of the diffracted light beam is. Unless N.A. of the lens is large, it is impossible to incorporate the diffracted light beam. The shorter the exposure wavelength $\lambda$ is, the smaller the angle of the diffracted light beam is with an identical pattern. Therefore, it is enough that N.A. is small. The resolution and the depth of focus are expressed by the following expressions.

$$\text{Resolution} = k1 \times \lambda / \text{N.A.}$$

$$\text{Depth of focus} = k2 \times \lambda / (\text{N.A.})^2$$

(in the expressions, k1 and k2 are proportional constants).

Therefore, it is appreciated that N.A. may be increased, or $\lambda$ may be shortened, in order to improve the resolution. According to the expressions described above, it is advantageous to shorten $\lambda$ in view of the depth of focus. From such a viewpoint, the wavelength of the light source is progressively shortened from the g-ray (436 nm) to the i-ray (365 nm), the excimer laser such as KrF (248 nm), ArF (193 nm) and $F_2$ (157 nm).

When the antireflection film for the visible region is formed by means of the dry process, a variety of coating materials have been successfully used. For example, $TiO_2$ (refractive index n=2.4 to 2.7 at $\lambda$=500 nm) has been used as the maximum refractive index material, and $MgF_2$ (refractive index n=1.38 at $\lambda$=500 nm) has been used as the minimum refractive index material. However, when the ultraviolet light beam in the vicinity of 200 nm is used, only a few coating materials can be used, because almost all substances absorb the light beam in this wavelength region. For example, the substance, which is generally used as the maximum refractive index material, is represented by $LaF_3$, $NdF_3$, and $GdF_3$ (any of the materials has a refractive index n=about 1.7 at $\lambda$=200 nm). The minimum refractive index material is represented by $Na_3AlF_6$ (refractive index n=1.36 at $\lambda$=200 nm). Therefore, the difference in refractive index between the maximum refractive index and the minimum refractive index of the coating materials used at the wavelength of 200 nm is extremely smaller than the difference in refractive index among those of the coating materials used in the visible region. Therefore, it is difficult to form an optical thin film for the ultraviolet region having high optical performance.

As described above, the coating material, which is usable in the ultraviolet region, is limited to the several types. Therefore, it is difficult to design a high performance optical thin film for the ultraviolet region as compared with the optical thin film for the visible region. In the visible region, a low reflectance antireflection film has been obtained, which has a wide band width to reduce the reflectance (for example, the reflectance is not more than 0.5% in a wavelength region of 400 nm to 800 nm). In spite of such problems that the production time is prolonged and the production cost is expensive, the high performance antireflection film as described above can be realized by laminating a large number of, i.e., eight layers, nine layers or more layers of antireflection film layers. As for the antireflection film for the ultraviolet region, no sufficiently satisfactory performance has been obtained yet for the reason as described above. However, an antireflection effect is obtained by providing the film construction having a multilayered structure composed of about ten layers in the same manner as in those for the visible region. On the other hand, it has been clarified by simulation that the antireflection effect for the ultraviolet light beam can be extremely enhanced when only the uppermost layer of the antireflection film layers is a super low refractive index film having a refractive index of not more than 1.30. Further, it is also possible to decrease the number of layers of the antireflection film as a whole. Therefore, such an antireflection film is also advantageous in production time and cost. Therefore, if a super low refractive index film having a refractive index of not more than 1.30 is formed, the resolution of the optical system is successfully improved to greatly contribute to the realization of high performance of the semiconductor-producing apparatus provided with the projection optical system for which the high resolution is required.

In order to lower the refractive index of the film, it is known that the structure of the film is not dense but porous. In general, it is defined that the film has a structure composed of a plurality of minute pores to separate accumulated solid substance. Therefore, the relationship between the filling density and the refractive index of the film is represented as follows.

$$n_f = n_0 \times P + n_p \times (1-p)$$

In the expression, $n_p$ represents the refractive index of the substance (for example, air or water) with which the minute pores are filled, $n_f$ and $n_0$ represents the real refractive index (depending on the filling density) and the refractive index of the accumulated solid material, and P represents the filling rate of the film. Further, the filling rate is defined as follows.

$$P = \text{(volume of solid portion of film)/(total volume of film (solid portion+minute pore portion))}$$

According to the foregoing expression, it is understood that the refractive index $n_f$ is low when the filling density is low.

In general, the dry process such as the vapor deposition and the sputtering is appropriate in order to obtain a dense film. However, the wet process is appropriate in order to obtain a porous film. For example, Ian M. Thomas, Applied Optics, Vol. 31, No. 28 (1992), pp. 6145–6149 discloses the production of an $SiO_2$ film having a low filling density and a high purity by means of a sol-gel process by using a raw material of an alkoxide solution of silicon. When ammonia is added as a catalyst for the hydrolysis reaction of alkoxide, it is possible to prepare minute spherical $SiO_2$ particles having high purity. When the solution (sol solution), in which such minute particles are suspended, is applied onto a substrate surface, and the dispersion medium of alcohol is vaporized or evaporated at room temperature, then it is possible to prepare a porous $SiO_2$ film composed of spherical $SiO_2$ particles, i.e., an $SiO_2$ film having a low filling density. In the case of the $SiO_2$ film produced by the wet process, the filling rate can be changed from 1 to about 0.5. Therefore, the refractive index can be changed from 1.45 to 1.22 in the visible region. As a result, it is possible to obtain a monolayer antireflection layer having a reflectance of almost 0% on optical glass by using the low filling density $SiO_2$ prepared by the wet process. As well-known, the antireflection film, which is composed of the low filling density $SiO_2$ film, has high laser durability. Therefore, the antireflection film is used for the high output laser such as those used for the nuclear fusion.

The wet process is advantageous in that the refractive index of the film can be made low. However, impurities (for example, carbon) originating from the materials and the solvent are adhered to the surfaces of the synthesized minute particles. A problem arises in that the transmittance in the ultraviolet region is lowered. In order to completely remove the impurities, it is necessary to heat-treat the film at a high temperature of at least not less than 500° C. However, if the formed film is heat-treated at a temperature of not less than 500° C., it is feared that the porous film may be densified to increase the refractive index, or the film may be oxidized to lower the transmittance when the film is composed of fluoride. Further, it is also feared that the substrate may be deformed if the heat resistance is low. Therefore, it is extremely difficult to perform the heat treatment at a temperature of not less than 500° C. so that the impurities are completely removed. That is, the wet process has involved the following problem. That is, it is impossible to sufficiently increase the transmittance in the ultraviolet region, because the impurities originating from the raw materials and the solvent are adhered to the surfaces of the minute particles, and it is impossible to completely remove the impurities. The projection optical system of the reduction projection exposure apparatus for producing the semiconductor device comprises a group of several tens of lenses, in which the antireflection films are required for both surfaces of each of the lenses. Therefore, even if the absorbance of the film is slightly increased, the projection lens suffers from large loss as a whole. In order to secure a sufficient exposure amount, it is extremely important to decrease the light absorption caused by the film as possible.

$SiO_2$ absorbs the ultraviolet light beam having a wavelength of not more than 180 nm. Therefore, the $F_2$ excimer laser having a wavelength of 157 nm is not transmitted therethrough. Accordingly, it is necessary to use a thin film of fluoride such as $MgF_2$ and $CaF_2$ so that sufficient transmittance is also exhibited for the ultraviolet light beam having an extremely short wavelength as described above. Ian M. Thomas, Applied Optics, Vol. 27, No. 16 (1988), pp. 3356–3358 discloses the production of a porous thin film composed of $MgF_2$ and $CaF_2$ by means of the wet process. The thin film had a sufficiently high transmittance at a wavelength in the vicinity of 350 to 400 nm. However, the transmittance was suddenly lowered at a wavelength shorter than the above. The present inventors consider that the reason of this phenomenon resides in the influence of carbon originating from the material as described above.

A first object of the present invention is to provide an optical element provided with an optical thin film in which the refractive index in the ultraviolet region at a wavelength of not more than 300 nm is not more than 1.30, and the transmittance loss of ultraviolet light in the same wavelength region is not more than 0.5%, and an exposure apparatus which has such an optical element.

A second object of the present invention is to provide an optical element provided with an optical thin film which is excellent in incidence angle characteristic and which has a good reflectance with respect to each of light beams having incidence angles in a wide range, and an exposure apparatus which has such an optical element.

SUMMARY OF THE INVENTION

According to a first aspect of the present invention, there is provided a method for forming an optical thin film, comprising a first step of preparing a sol solution containing minute particles dispersed in a dispersion medium; a second step of performing at least one of heating and pressurization for the sol solution obtained in the first step; and a step of applying the sol solution obtained in the second step onto an optical substrate. The present inventors have succeeded in obtaining an antireflection film having a refractive index of not more than 1.30 with respect to a light beam in a wavelength region of not more than 300 nm by using the method of the present invention.

In the case of the conventional wet process, a sol solution, which contains minute particles dispersed therein, is applied onto a substrate as it is. When the dispersion medium of the sol solution applied onto the substrate is evaporated or vaporized, then the minute particles are accumulated, and thus a porous film is formed. However, in the case of the conventional wet process, there is such a tendency that the minute particles are conglutinated with each other during the process of drying the film and thus the film is densified, in which the filling rate of the film has been high, i.e., the porosity of the film has not been sufficiently high. As a result, it has been unsuccessful to obtain a film having a sufficiently low refractive index with respect to the light beam in the short wavelength region. In the present invention, the optical thin film, which has a sufficiently low filling rate, has been successfully formed by heating and/or pressurizing the sol solution in the second step. The reason thereof will be explained below as exemplified by the preparation of a sol solution containing minute particles of magnesium fluoride.

In order to prepare the sol solution containing the minute particles of magnesium fluoride, for example, magnesium acetate and hydrofluoric acid are reacted in methanol solvent in accordance with the following formula.

$Mg(CH_3COO)_2 + 2HF \rightarrow MgF_2 + 2CH_3COOH$

When the obtained sol solution containing the minute particles of magnesium fluoride is pressurized and/or heated, the deposition reaction is accelerated to deposit unreacted magnesium ion and fluorine ion adhered to the surroundings of the $MgF_2$ minute particles generated by the reaction. Accordingly, the grain growth is facilitated for the $MgF_2$ minute particles to increase the size of the $MgF_2$ minute particles (primary particles) formed in the sol solution as compared with a case in which the heating and/or the pressurization is not performed. Subsequently, when the sol solution is applied onto the optical substrate, the $MgF_2$ primary particles are coagulated with each other while drying the dispersion medium to form secondary particles. During this process, the $MgF_2$ primary particles are grown to have relatively large particle diameters. Therefore, the surface energy is low, giving a stable energy state as compared with the case in which the heating and/or the pressurization is not performed. Further, as described later on, the surface of $MgF_2$ is still more stabilized owing to the function of the dispersion medium to clean the outer circumferential portions of the $MgF_2$ primary particles. Therefore, it is considered that the secondary particles are mutually formed while allowing sufficient pores to remain when the $MgF_2$ primary particles make contact with each other. Accordingly, the secondary particles are accumulated to form the porous film while maintaining the voids therebetween as shown in a sectional view of the film in FIG. 12(b). The filling rate of the film, which is calculated from the refractive index, may be not more than 70%, and especially not more than 40%. An extremely low refractive index of 1.10 to 1.3 is obtained with the film having a high porosity (low filling rate) as described above. Especially, in an embodiment described later on, an optical thin film having a refractive index of 1.16 with respect to a light beam having a wavelength of 193 nm was obtained. On the contrary, when the sol solution is not pressurized and/or heated, the $MgF_2$ primary particles have small particle diameters with their surfaces which are unstable in view of the energy. Therefore, it is considered that when such a sol solution is applied onto the substrate, the $MgF_2$ primary particles are strongly conglutinated with each other to form a film having a small amount of pores as shown in a sectional view of the film in FIG. 12(a).

The wavelength of the light beam to be used for the antireflection film of the present invention is short, i.e., not more than 300 nm, for example, 157 nm, 193 nm, or 248 nm. Therefore, it is desirable for the minute particles in the sol solution or the film formed by using the same to further satisfy the following three conditions. That is, (i) the minute particles contain few impurities which absorb the ultraviolet light beam, (ii) the particle diameter is minute, i.e., several nm in order to decrease the scattering, and (iii) the film is crystallized so that the crystal phase is not changed by being irradiated with the ultraviolet light beam. Representative substances, which transmit the ultraviolet light beam having a wavelength of not more than 300 nm, are quartz ($SiO_2$) and fluorite ($CaF_2$). Usually, such a material is used for the lens of the projection optical system of the reduction projection exposure apparatus based on the use of the KrF or ArF excimer laser. The sol solution is applied onto the substrate composed of such a material to form the film. After the film is formed, the sol solution is heat-treated together with the substrate in order to remove any impurity such as carbon. However, when the substrate is made of fluorite, the substrate is deformed if the heat treatment is performed at a temperature higher than 250° C. It is impossible to completely remove the residual carbon even when the heat treatment is performed at a temperature not more than 250° C. Therefore, carbon remains in the film. The carbon, which is not removed, absorbs the ultraviolet light beam to lower the transmittance. Therefore, it is necessary to obtain an extremely small amount of impurities such as carbon remaining in the minute particles before the application onto the substrate. However, since the method of the present invention has the second step as described later on, the method is also effective to remove the impurities from the minute particles. Further, the optical thin film, which is obtained in accordance with the method of the present invention, can be wiped up with ease. Therefore, even when the optical characteristics are deteriorated after the use for a long period, then the optical thin film can be removed by wiping up the film, and a new film can be formed on the optical substrate again.

According to a second aspect of the present invention, there is provided an optical element comprising an optical substrate; and an optical thin film which is formed on the optical substrate; wherein the optical thin film is formed of a fluoride, and the optical thin film has a refractive index of 1.10 to 1.30 with respect to a light beam in an ultraviolet region having a wavelength of not more than 300 nm. The optical element of the present invention is excellent in reflectance and antireflection characteristic with respect to the light beam in the ultraviolet region having the wavelength of not more than 300 nm, because the optical element of the present invention has the low refractive index of 1.10 to 1.30 with respect to such a light beam. Especially, the transmission loss of the optical element of the present invention is not more than 0.5%. Preferably, the optical thin film of the optical element of the present invention has a low refractive index of 1.10 to 1.30 with respect to a light beam having a wavelength of 150 nm to 300 nm. Especially preferably, the optical thin film has a low refractive index of 1.15 to 1.28 with respect to a light beam having a wavelength of 150 nm to 250 nm. Much more especially preferably, the optical thin film has a low refractive index of 1.15 to 1.25 with respect to a light beam having a wavelength of 150 nm to 200 nm.

Figure 12A:
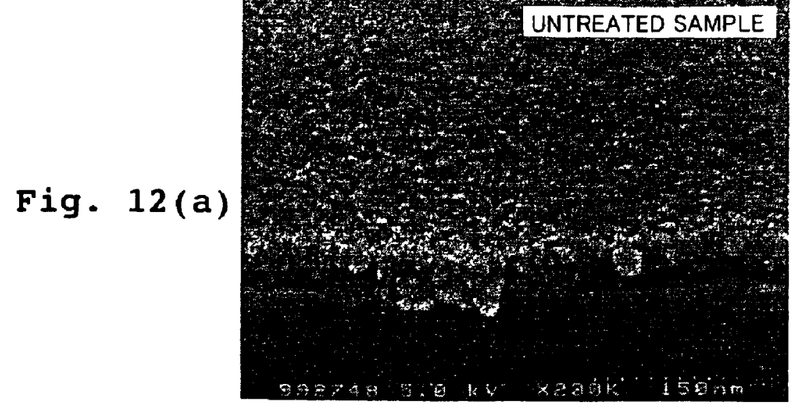
Figure 12B:
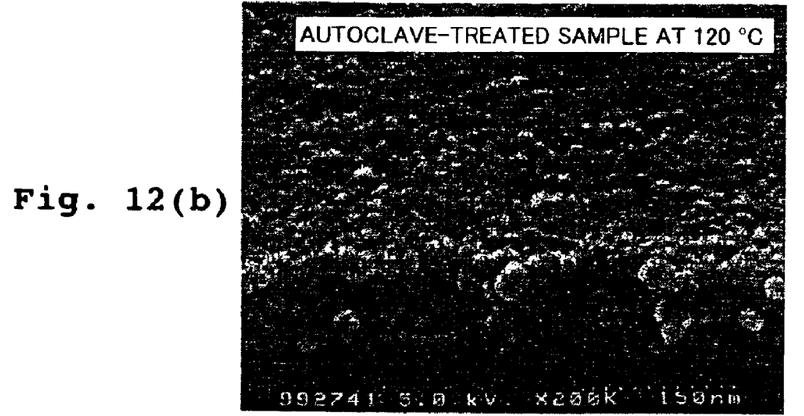

As shown in a cross section of the film in FIG. 12(b), the optical thin film of the optical element of the present invention has large voids between the secondary particles. When such a property is expressed with the filling rate of the film, for example, the filling rate is low, i.e., 37.3% to 65.4% (corresponding to the refractive index of 1.16 to 1.28).

According to a third aspect of the present invention, there is provided an exposure apparatus for exposing a substrate by projecting an image of a pattern on a mask onto the substrate, the exposure apparatus comprising:

an illumination optical system which illuminates the mask with an exposure light beam of a light beam in an ultraviolet region having a wavelength of not more than 300 nm; and a projection optical system which includes an optical element for projecting the image of the pattern on the mask onto the substrate, wherein:

the optical element has an optical substrate and an optical thin film formed on the optical substrate, the optical thin film is formed of a fluoride, and the optical thin film has a refractive index of 1.10 to 1.30 with respect to the light beam having the wavelength.

According to a fourth aspect of the present invention, there is provided an exposure apparatus for exposing a substrate by projecting an image of a pattern on a mask onto the substrate, the exposure apparatus comprising:

an illumination optical system which illuminates the mask with an exposure light beam of a light beam in an ultraviolet region having a wavelength of not more than 300 nm; and an optical element which is included in the illumination optical system, wherein:

the optical element has an optical substrate and an optical thin film formed on the optical substrate, the optical thin film is formed of a fluoride, and the optical thin film has a refractive index of 1.10 to 1.30 with respect to the light beam having the wavelength.

According to the exposure apparatuses of the third and fourth aspects of the present invention, the optical element such as a lens to be used for the illumination optical system or the projection optical system has the optical thin film which is formed in accordance with the present invention. Therefore, even when the vacuum ultraviolet light beam is used as the exposure light beam, then the reflectance is low, and the incidence angle characteristic is excellent. Therefore, even when an optical lens having large N.A. is used, the exposure light beam can be effectively radiated onto the mask or the substrate.

BRIEF DESCRIPTION OF THE DRAWINGS

FIG. 12($a$) shows a sectional view of a film obtained by means of a conventional wet process, FIG. 12($b$) shows a sectional view of a film obtained by performing the autoclave treatment at 120° C., and FIG. 12($c$) shows a sectional view of a film obtained by performing the autoclave treatment at 180° C.

DESCRIPTION OF THE PREFERRED
EMBODIMENTS OF THE INVENTION

Preparation of Sol Solution (First Step)

In the present invention, the sol solution is prepared as follows. Minute particles of fluoride or oxide are preferably used for the minute particles contained in the sol solution in order to maintain a high transmittance with respect to a light beam having a short wavelength of not more than 300 nm. Those especially preferably usable as the fluoride include fluorides of alkaline earth metal such as barium, strontium, calcium, and magnesium, because of the high transmittance for the ultraviolet light beam. Those preferably usable as the oxide include quartz and quartz doped with fluorine for the same reason.

In order to prepare the sol solution, a compound of alkaline earth metal such as calcium or magnesium is dissolved in distilled water or organic solvent such as methanol to prepare an alkaline earth metal solution. A fluorine source is diluted with distilled water or organic solvent such as methanol to prepare a hydrofluoric acid solution. The alkaline earth metal solution and the hydrofluoric acid solution are mixed with each other. The particle diameter of the synthesized minute particles of fluoride is extremely fine and minute, i.e., several nm to several tens nm. Therefore, the minute particles are dispersed in the dispersion medium without being precipitated. Thus, a so-called sol solution is obtained. Those preferably usable as the alkaline earth metal compound to prepare the alkaline earth metal solution include, for example, acetate, chloride, and alkoxide. Those preferably usable as the fluorine source include, for example, aqueous solution of hydrofluoric acid (fluorinated acid), anhydrous hydrogen fluoride, and trifluoroacetic acid. However, it is also possible to use, for example, a gas of fluorine or hydrogen fluoride.

Anions originating from the raw materials are adhered or coordinated on the surfaces of the minute particles of fluoride immediately after the synthesis. For example, when the acetate of alkaline earth metal is used for the raw material, acetic acid or acetate ion is coordinated on the surfaces of the minute particles of fluoride. The surface area is also extremely large, because the particle diameter is extremely fine and minute, i.e., about 10 nm. A large amount of anion is adhered to the surfaces of the minute particles. If such a sol is subjected to coating as it is, then the acetic acid or the acetate ion, which remains in a film, absorbs the ultraviolet light beam, and the transmittance is consequently lowered. In the present invention, the impurity concentration can be remarkably lowered by means of the second step.

Pressurization and/or Heat Treatment (Second Step)

In the second step of the present invention, the sol solution obtained in the first step is pressurized or heated. Alternatively, the heating and the pressurization are performed simultaneously for the sol solution. For example, the sol solution obtained in the first step is put in a tightly closable vessel, for example, in an autoclave to effect the heating. Thus, the heating and the pressurization can be performed simultaneously (autoclave treatment). In this procedure, the surfaces of the minute particles are more stabilized by adjusting the temperature to 100° C. to 300° C. and adjusting the pressure to 1 kg/cm$^2$ to 80 kg/cm$^2$. When the minute particles are accumulated, it is possible to form a film having a high porosity. The heat treatment for the sol solution as described above is called "hydrothermal treatment" when the dispersion medium is water. However, the heat treatment is called "organothermal treatment", "solvothermal treatment", or "autoclave treatment" when the dispersion medium is organic solvent.

Figure 13:
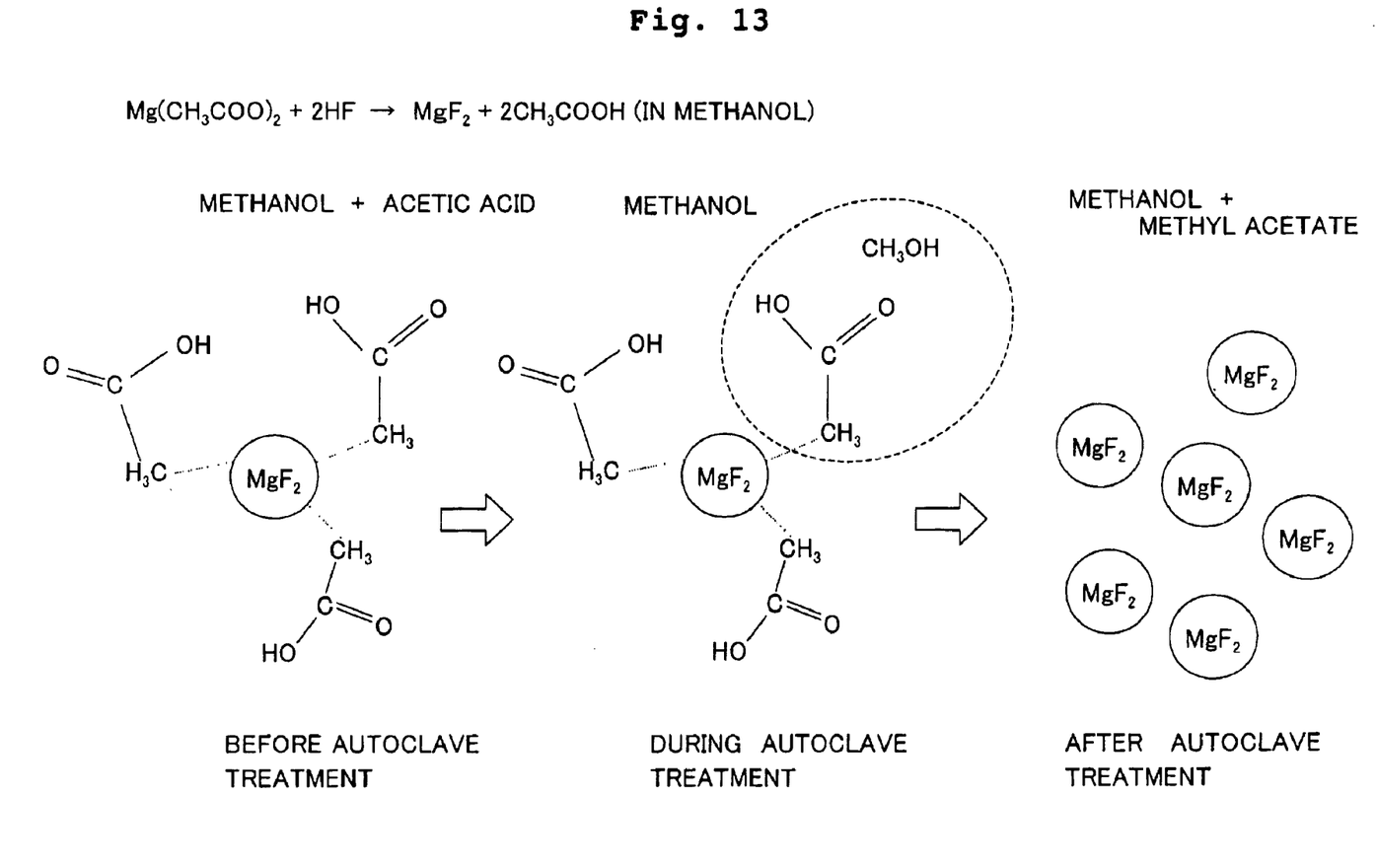
FIG. 13 conceptually shows the change of the surrounding environment for magnesium fluoride generated by the autoclave treatment.

As described above, the anions originating from the raw materials and the compounds containing the same are adsorbed to the surfaces of minute particles, or they remain in the dispersion medium at the stage at which the sol solution is prepared. However, the anions and the compounds containing the same can be reacted with the dispersion medium by appropriately selecting the dispersion medium. For example, when the acetate such as magnesium acetate is used for the raw material for the minute particles as shown in the formula described above, acetic acid is also synthesized together with the minute particles of fluoride such as magnesium fluoride. Acetic acid molecules adhere to the surfaces of the minute particles as shown in FIG. 13, and they remain in the dispersion medium. Further, the acetic acid molecules have high polarity as shown in FIG. 13. Therefore, negative polarity portions and positive polarity portions of adjoining acetic acid molecules make attraction to one another to form a strong network of the acetic acid molecules in the sol solution. When the treatment, for example, the autoclave treatment is performed under the pressurization and/or the heating by using the organic solvent such as methanol as the dispersion medium, acetic acid is reacted with methanol to produce methyl acetate. Methyl acetate is easily evaporated together with the dispersion medium, because it has a high vapor pressure. Therefore, acetic acid is removed from the surfaces of the minute particles and from the dispersion medium, and the surfaces of the minute particles are cleaned. As a result, as shown in FIG. 13, the MgF$_2$ secondary particles are in a state of being released from surrounding acetic acid molecules after the autoclave treatment. It is noted that the reaction between acetic acid and methanol does not take place at the room temperature and at the atmospheric pressure.

When methoxide, which is one of alkoxides, is used as the raw material for the minute particles in place of acetate, dimethyl ether is produced. Dimethyl ether does not form the network in the sol solution unlike acetic acid, because it has low polarity. When chloride is used as the raw material for the minute particles in place of acetate, then hydrochloric acid is produced by the autoclave treatment when water is used as the dispersion medium, and the surfaces of the minute particles may be cleaned. As described above, the dispersion medium is selected depending on the type of the raw material to be used to prepare the sol solution. However, in the case of the organic solvent, when one having a low molecular weight such as methanol, ethanol, and diethyl ether is used, the reaction can be caused at a relatively low temperature, which is preferred.

It is considered that the laser resistance is improved, because the crystallinity of the minute particles is improved by performing the autoclave treatment. That is, if the ultraviolet light beam is radiated onto an amorphous film, then the light energy absorbed by the film is converted into the thermal energy, and the heat tends to crystallize the film. If the amorphous film is crystallized, then the volume is contracted or decreased to cause cracks, and the destruction of the film occurs from starting points of such cracks. When the film is crystallized from the beginning, any further crystallization hardly occurs, even when any thermal energy is generated. Further, when the film is porous, then the stress is mitigated, and cracks hardly appear, even when the volume is contracted or decreased.

Application of Sol Solution (Third Step)

In order to uniformly apply the sol solution onto the substrate in the third step of the present invention, the spin coat method, the dipping method, the spray method, or the meniscus method is used. The dipping method is suitable for a large-sized substrate having an irregular shape or a curved surface. The spin coat method is suitable for a small-sized substrate having a circular shape with a flat surface or a surface having a gentle radius of curvature. The meniscus method is especially suitable for a large-sized flat substrate. These techniques are disclosed, for example, in "Sol-Gel Science", Academic Press, Inc., Sandiego, 1990 written by Brinker and Sherer and "Thin Solid Films", Vol. 175 (1989), pp. 173–178 written by Floch and Priotton et. al. The spin coat method is preferred, because the substrate, onto which the sol solution is intended to be applied in the present invention, is principally a circular optical lens. When the optical lens is large-sized, the dipping method is also preferred.

When the velocity of evaporation of the dispersion medium of the sol solution is too fast, the sol solution can be uniformly applied without any unevenness, provided that a part of the dispersion medium is substituted with a dispersion medium having a low vapor pressure to suppress the velocity of evaporation. For example, when the dispersion medium is methanol, the film tends to be uneven, because the velocity of evaporation is too fast. When a part of the dispersion medium is substituted with higher alcohol such as propanol and butanol, then the velocity of evaporation is suppressed, and the sol solution can be uniformly applied. The solvent, with which the dispersion medium is substituted, is not limited to alcohols. Almost all of organic solvents can be used. Those usable as the organic solvent include, for example, alcohols such as ethanol, propanol, butanol, pentanol, hexanol, octanol, nonanol, benzyl alcohol, methylcyclohexanol, ethanediol, propanediol, butanediol, pentanediol, hexanediol, octanediol, and hexanetriol; esters such as butyl formate, pentyl formate, methyl acetate, ethyl acetate, propyl acetate, butyl acetate, pentyl acetate, hexyl acetate, benzyl acetate, 3-methoxyphenyl acetate, 2-ethylbutyl acetate, 2-ethylhexyl acetate, methyl propionate, ethyl propionate, propyl propionate, butyl propionate, and pentyl propionate; amides such as dimethylformamide, dimethylacetoamide, diethylformamide, and diethylacetoamide; ketones such as dimethyl ketone, methyl ethyl ketone, pentanone, hexanone, methyl isobutyl ketone, heptanone, and diisobutyl ketone; nitrites such as acetonitrile; ethers such as diethyl ether, dipropyl ether, diisopropyl ether, dibutyl ether, and dihexyl ether; cyclic ethers such as anisole, tetrahydrofuran, and tetrahydropyran; ethylene glycol ethers such as dimethoxyethane, diethoxyethane, dibutoxyethane, diethylene glycol dimethyl ether, diethylene glycol diethyl ether, and ethylene glycol dibutyl ether; acetals such as methylal and acetal; paraffinic hydrocarbons such as pentane, hexane, heptane, octane, nonane, decane, and dodecane; cyclic hydrocarbons such as toluene, xylene, ethylbenzene, cumene, mesitylene, tetralin, butylbenzene, cymene, diethylbenzene, pentylbenzene, dipentylbenzene, cyclopentane, cyclohexane, methylcyclohexane, ethylcyclohexane, and decalin; and halogenated hydrocarbons such as chloromethane, dichloromethane, trichloromethane, tetrachloromethane, chloroethane, dichloroethane, trichloroethane, tetrachloroethane, pentachloroethane, chloropropane, dichloropropane, trichloropropane, chlorobutane, dichlorobutane, trichlorobutane, chloropentane, chlorobenzene, dichlorobenzene, chlorotoluene, dichlorotoluene, bromomethane, bromopropane, bromobenzene, and chlorobromoethane.

The organic solvent as described above has the following tendency. That is, the larger the number of carbons is, the lower the vapor pressure is, and the higher the viscosity is. However, if an organic solvent, which has excessively low vapor pressure and excessively high viscosity, is added to the sol solution, it is difficult to perform the spin coat. If an organic solvent having a large number of carbons remains in the film, the organic solvent causes absorption of the ultraviolet light beam. Therefore, when a single organic solvent is used, it is preferable to use an organic solvent having a number of carbon or carbons of not more than 6. Alternatively, it is preferable to perform the spin coat after the vapor pressure and the viscosity are adjusted by adding a small amount of organic solvent having a number of carbons of not less than 6 to the organic solvent having a number of carbon or carbons of not more than 6. Those especially preferred among the organic solvents described above are higher alcohols such as propanol, butanol, and pentanol. In particular, for example, those especially preferred are structural isomers thereof, i.e., 1-propanol, 2-propanol, 1-butanol, 2-butanol, tert-butyl alcohol, isobutyl alcohol, 1-pantanol, 2-pentanol, 3-pentanol, 2-methyl-1-butanol, isopentyl alcohol, tert-pentyl alcohol, 3-methyl-2-butanol, and neopentyl alcohol.

As described above, the refractive index of the film can be remarkably lowered by performing the autoclave treatment for the sol solution. However, the present inventors have found out the fact that when the dispersion medium is substituted with an organic solvent different from the dispersion medium of the sol solution according to the present invention, the refractive index can be further lowered. When the spin coat is performed after the dispersion medium is substituted with the organic solvent having high viscosity, the following tendency has been observed. That is, the filling density of the minute particles for forming the film is lowered, the porosity is increased to some extent, and the refractive index is lowered. When this technique is used, it is possible to further lower the refractive index of the film.

EXAMPLE 1

A sol solution of magnesium fluoride was prepared in accordance with a method disclosed in Ian M. Thomas, Applied Optics, Vol. 27, No. 16 (1988), pp. 3356–3358. Magnesium acetate tetrahydrate was dissolved in methanol. An aqueous solution of hydrofluoric acid (fluorinated acid) having a concentration of 50% was diluted with methanol. When the methanol solution of hydrofluoric acid was added little by little while agitating the methanol solution of magnesium acetate, minute particles of magnesium fluoride were immediately synthesized in accordance with the following formula.

$$Mg(CH_3COO)_2 + 2HF \rightarrow MgF_2 + 2CH_3COOH$$

The obtained sol solution was colorless and transparent, but it had an odor of acetic acid. The concentrations of magnesium acetate and hydrofluoric acid were adjusted respectively so that the concentration of obtained magnesium fluoride was 1% by weight. The sol solution of magnesium fluoride of 1% by weight was put in a pressure-resistant vessel (autoclave) made of Teflon, and the vessel was tightly closed. A heat treatment was performed at a temperature of 120° C. for 24 hours. The pressure in the vessel in this procedure was 7 kg/cm$^2$. Heat treatments were performed for 24 hours at respective temperatures of 140° C., 160° C., and 180° C. for three sol solutions of magnesium fluoride of 1% by weight prepared in the same manner as described above. The pressures in the vessel in these procedures were 12 kg/cm$^2$, 18 kg/cm$^2$, and 28 kg/cm$^2$ respectively. The sol solution was also colorless and transparent even when the autoclave treatment was performed at any of the temperatures. However, the odor of acetic acid disappeared, but an odor of ester appeared. When the sol solution before the autoclave treatment was analyzed with the gas chromatography, acetic acid was detected. Methyl acetate was detected from the sol solution after the autoclave treatment.

The sol solutions, which were obtained by the autoclave treatments at the various temperatures as described above, were concentrated by evaporating the dispersion medium. Any one of the solutions was not gelled. Each of the solutions was successfully concentrated up to about 10% by weight. When the sol solution can be concentrated to have a high concentration as described above, the ratio of dispersion medium substitution with higher alcohol can be raised up to about 90%. As a result, an advantage is obtained such that a large diameter lens can be subjected to the spin coat to give a uniform film thickness by using higher alcohol as the dispersion medium.

Subsequently, the autoclave-treated sol solution was spin-coated onto a quartz substrate to form a film. During this process, the sol solution was dripped onto the quartz substrate while rotating the substrate at 1000 rpm. In order to remove impurities, the substrate, on which the film had been formed, was heat-treated at 200° C. The cross-sectional structure of the film obtained as described above was observed with SEM. Results are shown in FIG. 12(b) and FIG. 12(c) for samples for which the temperatures of the autoclave treatment were 120° C. and 180° C. respectively. FIG. 12(a) shows a cross-sectional structure of a film formed in Comparative Example as described later on, in which the autoclave treatment was not performed. According to FIGS. 12(a)–(c), it is appreciated that pores are clearly present between grains for constructing the film when the autoclave treatment is performed, and the filling rate of the film is lowered. The refractive index and the transmission loss of the film on the substrate subjected to the heat treatment were measured with respect to an ultraviolet light beam having a wavelength of 193 nm. The refractive index and the transmission loss of the film had values shown in FIG. 11 respectively at the respective temperatures under the respective pressure conditions in the autoclave treatment. The filling rate of the film determined by calculation from the refractive index is also shown in the table in FIG. 11.

The transmittance was the same even when the film was not heat-treated at all after the spin coat for the film obtained in Example 1. Therefore, it is appreciated that the minute particles of magnesium fluoride in the sol solution contained a small amount of impurity which absorbed the ultraviolet light beam.

COMPARATIVE EXAMPLE 1

A sol solution of magnesium fluoride was prepared in the same manner as in Example 1. The obtained sol solution of 1% by weight was used to form a magnesium fluoride film by means of the spin coat method in the same manner as in Example 1. The substrate, on which the film had been formed, was heat-treated at 200° C. to obtain an optical thin film. The cross-sectional structure of the film obtained as described above was observed with SEM. The cross-sectional structure is shown in FIG. 12(a). The refractive index and the transmission loss of the film on the substrate subjected to the heat treatment were measured with respect to the ultraviolet light beam having the wavelength of 193 nm. The refractive index of the film, the filling rate, and the transmission loss were 1.352, 82%, and 0.18 respectively as shown in FIG. 11.

When the sol solution obtained in Comparative Example 1 was progressively concentrated by using a rotary evaporator without applying the autoclave treatment, then the sol solution was gelled, and the fluidity disappeared. When the reaction was effected while increasing the concentrations of magnesium acetate and hydrofluoric acid from the beginning, the solution was also gelled. Therefore, it was revealed that the sol solution failed to maintain the stable state if the concentration of magnesium fluoride was raised above 1%. It is considered that the reason why the sol solution was gelled when the solution was progressively concentrated is that acetic acid molecules adsorbed to the surfaces of the minute particles of magnesium fluoride and acetic acid molecules in the dispersion medium are intertwined with each other to form a network. Carbon remains in the magnesium fluoride thin film formed from the sol solution still containing acetic acid, and the decrease in transmittance is consequently caused.

Figure 11:
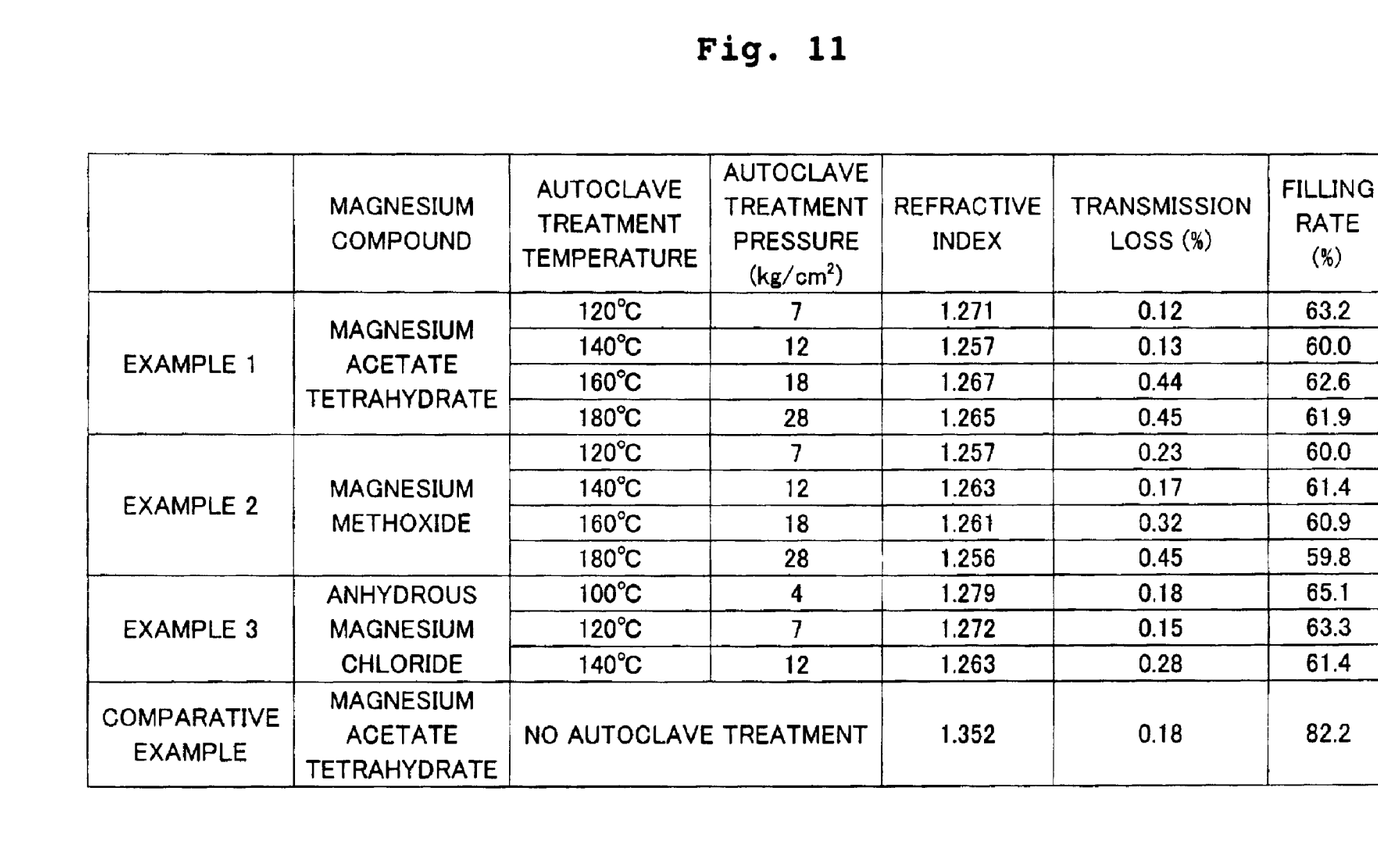
FIG. 11 shows a table illustrating the refractive index for an ultraviolet light beam having a wavelength of 193 nm, the filling rate, and the transmission loss of magnesium fluoride films obtained by performing the autoclave treatment at various temperatures.
Figure 12C:
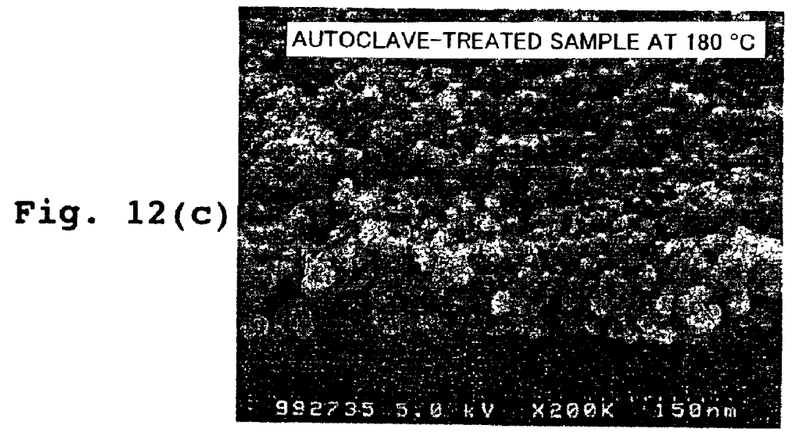

According to the results shown in FIG. 11, it is understood that the refractive index of the film obtained in Example 1 is approximately constant, i.e., about 1.26 irrelevant to the temperature of the autoclave treatment, and the refractive index is considerably low as compared with the film obtain in Comparative Example 1. The transmission loss of the film of Example 1 was higher than that of Comparative Example 1, when the autoclave treatment temperature was not less than 160° C. However, the transmission loss of the film of Example 1 was lower than that of Comparative Example 1 until the autoclave treatment temperature arrived at 140° C. Therefore, the magnesium fluoride film, which had the low refractive index and the small transmission loss, was successively formed when the sol solution was autoclave-treated at 120° C. or 140° C. The sol solution obtained in Example 1, which had been autoclave-treated at 140° C., was coated onto both surfaces of a quartz glass substrate, and the transmittance in the ultraviolet region was measured. The transmittance at a wavelength of 193 nm was extremely high, i.e., 99.6%, revealing that the excellent antireflection effect was exhibited in the ultraviolet region.

The composition was analyzed by means of the fluorescence X-ray analysis for pellets obtained such that a dry gel, which was obtained by completely evaporating the dispersion medium, was pulverized with a mortar, followed by being placed in a mold to perform press forming, for each of the sol solution of magnesium fluoride prepared in Comparative Example 1 and the sol solutions of magnesium fluoride prepared in Example 1 and autoclave-treated at 140° C. and 160° C. The ratio of fluorine (F)/magnesium (Mg) of magnesium fluoride in the sol solution not subjected to the autoclave treatment was 0.882. On the contrary, the ratio of F/Mg of magnesium fluoride in the sol solution treated at 140° C. was 1.060, and the ratio of F/Mg of magnesium fluoride in the sol solution treated at 160° C. was 1.094. It was confirmed that the ratio of F/Mg is improved by performing the autoclave treatment.

COMPARATIVE EXAMPLE 2

A thin film of magnesium fluoride was formed by means of a vacuum deposition method as follows. A substrate and a boat in which magnesium fluoride granules were accommodated were set to a vacuum evaporator. Evacuation was started, and the degree of vacuum in the vacuum evaporator was regulated to be $1\times10^{-6}$ Torr. The substrate was heated, and the substrate temperature was regulated to be 200° C. The electric power was applied to the boat to evaporate or vaporize magnesium fluoride so that the thin film of magnesium fluoride was formed on the substrate. After forming the film having a predetermined film thickness, the interior of the vacuum evaporator was allowed to be at the atmospheric pressure, and the substrate was taken out therefrom. The film thickness was adjusted to function as a $\lambda/4$ plate with respect to the light beam having the wavelength of 193 nm. The film, which was obtained by the vacuum deposition method, had a refractive index of 1.42 and transmission loss of 0.1%. The filling rate of the film, which was calculated from the refractive index, was 98.1%.

EXAMPLE 2

Four sol solutions each containing 1% by weight of magnesium fluoride were prepared in accordance with the same method as that used in Example 1 except that magnesium methoxide was used in place of magnesium acetate tetrahydrate. The sol solutions were semitransparent, and they were nonuniform with precipitated matters as well. Subsequently, the four sol solutions were placed in autoclaves made of Teflon respectively, and they were heat-treated for 24 hours at respective temperatures of 120° C., 140° C., 160° C., and 180° C. As a result, the precipitated matters disappeared, and the sol solutions were colorless and transparent. The internal pressures of the vessels were 7 kg/cm$^2$, 12 kg/cm$^2$, 18 kg/cm$^2$, and 28 kg/cm$^2$ respectively.

Each of the autoclave-treated sol solutions was spin-coated on a quartz substrate in the same manner as in Example 1 to form a thin film which was optically evaluated. The measured refractive indexes and the transmission losses are shown in FIG. 11. The refractive index of the film was about 1.26 which was lower than that obtained in Comparative Example 1. The filling rate, which was calculated from the refractive index value, was 60.7%. The transmission loss was lower than that obtained in Comparative Example 1 when the autoclave treatment temperature was 140° C. Therefore, it is appreciated that the MgF$_2$ film, which has the extremely low refractive index and the small transmission loss, can be formed by autoclave-treating the sol solution at 140° C.

It was difficult to spin-coat or dip-coat a sol solution obtained by performing no autoclave treatment as it was.

EXAMPLE 3

Three sol solutions each containing 1% by weight of magnesium fluoride were prepared in accordance with the same method as that used in Example 1 except that anhydrous magnesium chloride was used in place of magnesium acetate tetrahydrate. Subsequently, the sol solutions were heat-treated for 24 hours at respective temperatures of 100° C., 120° C., and 140° C. in the autoclaves made of Teflon. As a result, the magnesium chloride, which had been unreacted, was completely reacted with hydrofluoric acid. The internal pressures of the vessels were 4 kg/cm$^2$, 7 kg/cm$^2$, and 12 kg/cm$^2$ respectively. The sol solution, which was autoclave-treated at 100° C. or 120° C., was colorless and transparent, in which minute particles of magnesium fluoride were uniformly dispersed. When the sol solution before performing the autoclave treatment was dried to perform the X-ray diffraction analysis, unreacted magnesium chloride was detected in addition to magnesium fluoride.

Each of the autoclave-treated sol solutions was spin-coated on a quartz substrate in the same manner as in Example 1 to form a thin film which was optically evaluated. The measured refractive indexes and the transmission losses are shown in FIG. 11. When the autoclave treatment was performed at 100° C., the refractive index of the film was about 1.27 which was lower than that obtained in Comparative Example 1. The filling rate, which was calculated from the refractive index value, was 63.0%. The transmission loss was lower than that obtained in Comparative Example 1 when the autoclave treatment temperature was 100° C. or 120° C. Therefore, the magnesium fluoride film, which had the extremely low refractive index and the small transmission loss, was successfully formed by autoclave-treating the sol solution at 100° C.

EXAMPLE 4

When the spin coat was performed by using the sol solution of magnesium fluoride obtained at the autoclave treatment temperature of 140° C. in Example 1, radial stripes slightly appeared at a low number of revolutions of 750 to 1000 rpm. Accordingly, the sol solution was concentrated to give a concentration of 2%, the same weight of 1-propanol was added thereto to give a concentration of 1%, and then the solution was spin-coated onto a quartz substrate at 1000 rpm. As a result, no radial stripe appeared at all, and the solution was successively spin-coated uniformly. The solution was also successively spin-coated uniformly when 2-propanol, 1-butanol, 2-butanol, isobutyl alcohol, or tert-butyl alcohol was used in place of 1-propanol.

When the dispersion medium of the sol solution was lower alcohol such as methanol and ethanol, the film was apt to be nonuniform, because the velocity of evaporation was too fast. It is considered that when a part of the dispersion medium is substituted with higher alcohol such as butanol, the film is uniform, because the velocity of evaporation is suppressed, and the dispersion medium is uniformly evaporated. On the other hand, the sol solution having a concentration of 1% by weight can be hardly concentrated, unless the sol solution is autoclave-treated. Therefore, the dispersion medium of such a solution cannot be substituted. In this case, even when higher alcohol is added in order to perform the spin coat uniformly, the concentration of magnesium fluoride is lowered, because the sol solution is diluted. As a result, it is feared that the film thickness may be thin, and it is impossible to obtain a desired film thickness. On the contrary, the autoclave-treated sol solution can be concentrated to give a high concentration of about 10% by weight at maximum. Therefore, the sol solution, in which the dispersion medium is substituted with higher alcohol, can be prepared, while adopting an arbitrary magnesium fluoride concentration less than 10% by weight. The rate of substitution of the dispersion medium with higher alcohol can be raised to be not less than 90% as well. As a result, an advantage is obtained such that the thin film of magnesium fluoride having an arbitrary film thickness can be uniformly spin-coated on a lens having a large diameter.

When the dispersion medium is substituted with an organic solvent having high viscosity such as higher alcohol, an effect is also obtained such that the refractive index of the film is lowered, in addition to the effect that the film can be uniformly spin-coated. A magnesium fluoride film, which was obtained when the dispersion medium was not substituted, had a refractive index of 1.26. However, the refractive index was lowered to 1.25 when the dispersion medium was substituted with 2-propanol, 2-butanol, or 2-butanone. The refractive index of 1.25 corresponds to a filling rate of the film of 58.3%.

EXAMPLE 5

The sol solution of magnesium fluoride obtained at the autoclave treatment temperature of 140° C. in Example 1 was concentrated to give a concentration of 5%, the solution was diluted to 1% by adding 2-butanol, and then the solution was spin-coated onto a quartz substrate having a thickness of 3 mm at a velocity of rotation of the substrate of 1500 rpm. An obtained magnesium fluoride film had a film thickness of 535 angstroms. The refractive index was measured in the same manner as in Example 1. As a result, the refractive index was 1.20. The obtained refractive index was low as compared with a case in which a film was formed on a quartz substrate having a thickness of 0.5 mm. On the other hand, gadolinium fluoride ($GdF_3$) was formed as a film of 565 angstroms on a quartz substrate having a thickness of 3 mm by means of the vapor deposition method, and the same sol was used and spin-coated thereon at 1500 rpm. As a result, the film thickness of a magnesium fluoride layer was about 700 angstroms, and the refractive index was 1.16. The refractive index of 1.16 corresponds to a filling rate of the film of 37.3%. According to this experiment, it is appreciated that the lamination with the vapor-deposited layer makes it possible to obtain a lower refractive index.

EXAMPLE 6

Figure 2:
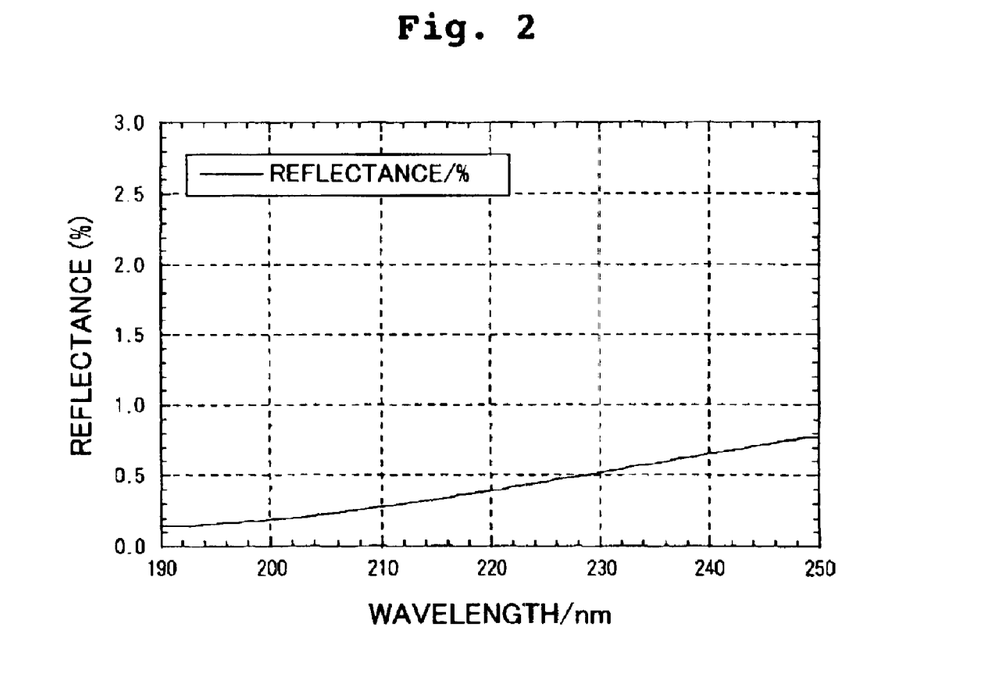
FIG. 2 shows a spectral reflection characteristic of a monolayer antireflection film according to the present invention.
Figure 3:
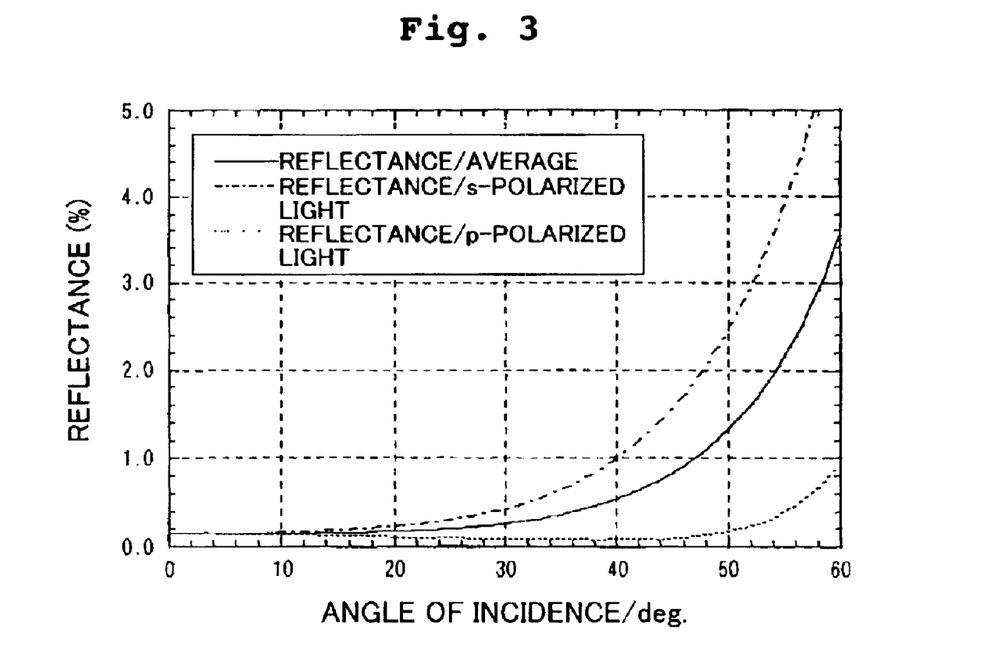
FIG. 3 shows an angular reflection characteristic of the monolayer antireflection film according to the present invention.
Figure 4:
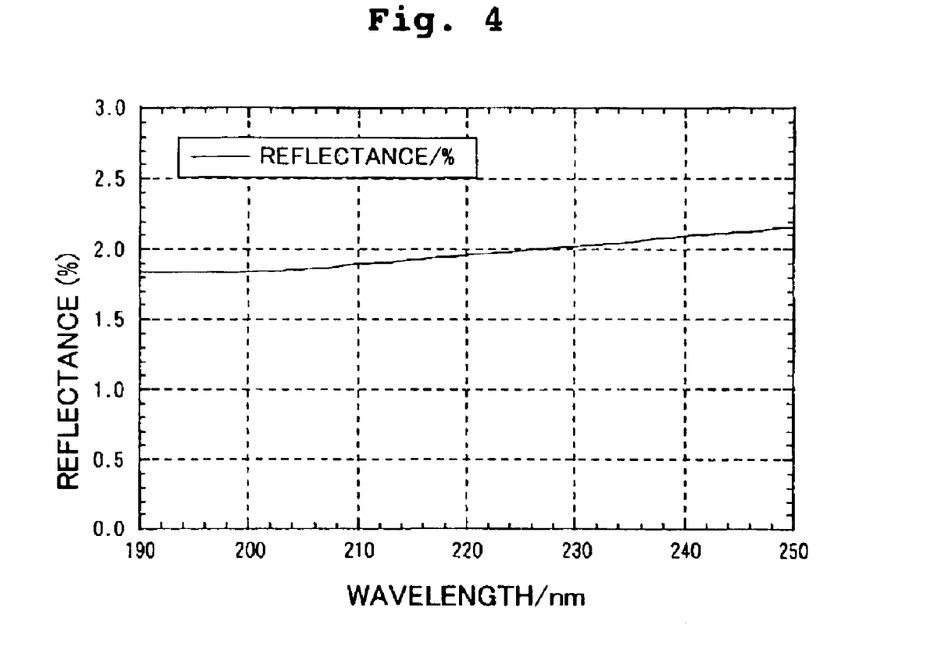
FIG. 4 shows a spectral reflection characteristic of a monolayer antireflection film formed by the vacuum deposition.
Figure 5:
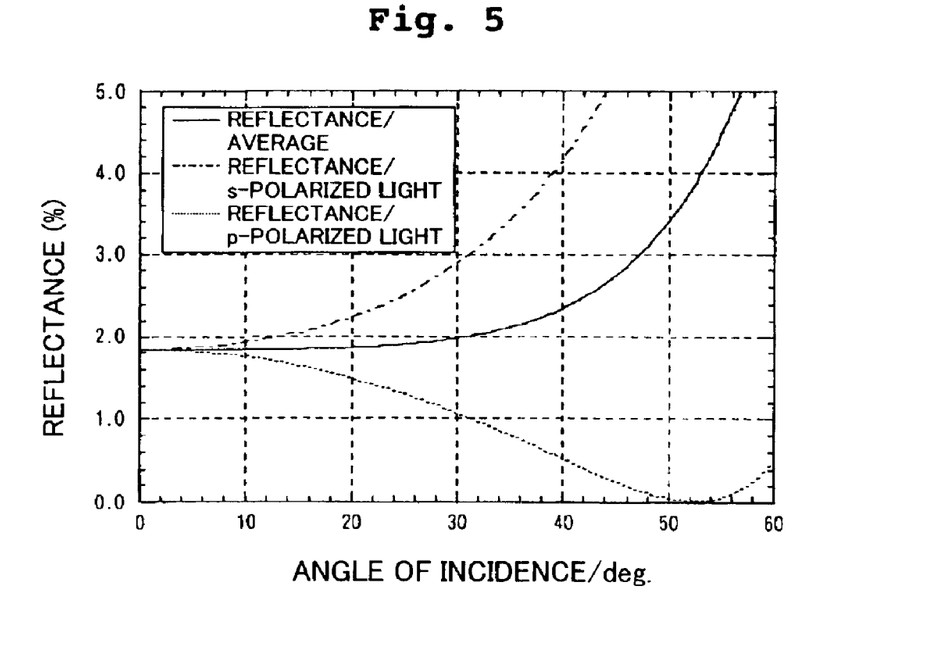
FIG. 5 shows an angular reflection characteristic of the monolayer antireflection film formed by the vacuum deposition.

A sol solution of 1% by weight of magnesium fluoride, which was prepared in the same manner as in Example 1, was autoclave-treated at 140° C. at a pressure of 12 $kg/cm^2$. The solution was spin-coated onto a quartz substrate after adjusting the concentration to 0.746% by weight to form a monolayer film of magnesium fluoride. The refractive index of the film was 1.29. The actual film thickness was 37.5 nm so that the optical film thickness (optical length) was 0.25 $\lambda$ at a wavelength of 193 nm. FIGS. 2 and 3 show results of the measurement of the spectral reflection characteristic and the angular reflection characteristic of the optical element at 193 nm. FIGS. 4 and 5 show results of the measurement of the spectral reflection characteristic and the angular reflection characteristic of the $\lambda/4$ monolayer antireflection film of magnesium fluoride formed by means of the vacuum deposition method in Comparative Example 2.

According to FIG. 2, it is appreciated that the antireflection film of the present invention has an antireflection effect in which the reflectance is not more than 0.5% over a wide wavelength range of not more than 229 nm, although the antireflection film is the monolayer film. Especially, the antireflection film of the present invention achieves the reflectance of not more than 0.2% at a wavelength of not more than 200 nm.

According to FIG. 3, as for the angular characteristics, the reflectance is not more than 0.5% up to the angle of incidence of 30° for respective polarized light components. The reflectance is also not more than 2.0% at an angle of incidence not less than the above, for example, at an angle of incidence of 54°. Therefore, it is appreciated that the antireflection film of the present invention has an excellent antireflection effect. On the other hand, as for the $\lambda/4$ monolayer antireflection film produced by the vacuum deposition method as described above, the refractive index is 1.42. According to FIG. 4, the reflectance is 1.83 to 2.15 in a wavelength region from 190 nm to 250 nm. According to FIG. 5, the reflectance is not less than 1.8% at incidence of 0° (vertical incidence). The difference in angular reflection characteristic between the s-polarized light component and the p-polarized light component was large. It was impossible to obtain any sufficient antireflection effect. As described above, it is appreciated that the antireflection film of the present invention is more excellent than the $\lambda/4$ monolayer antireflection film of magnesium fluoride produced by the vacuum deposition method.

EXAMPLE 7

Figure 1:
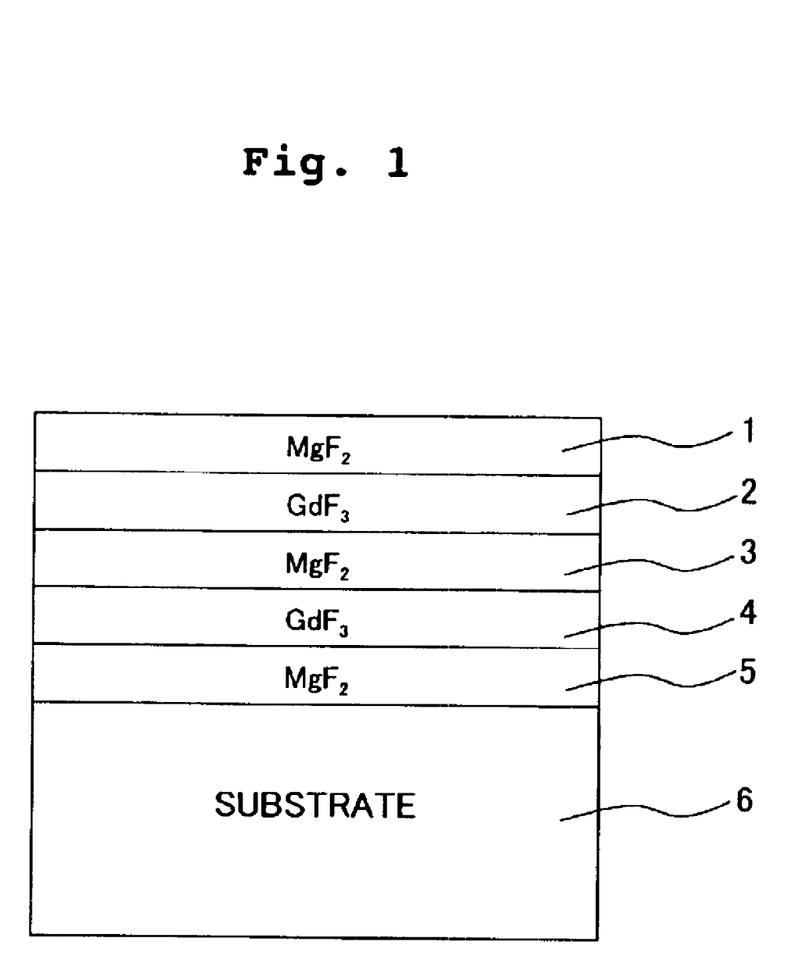
FIG. 1 shows a film arrangement of an antireflection film according to the present invention.

A five-layered antireflection film, in which a magnesium fluoride layer was arranged at the uppermost layer, was formed on a quartz substrate having a thickness of 3 mm by using the wet process according to the present invention. The film design, the method for forming the film, and the film thickness are as follows. In this design, the thicknesses of the respective layers were determined so that the angular characteristic was satisfactory at 193 nm. The arrangement of the antireflection film is shown in FIG. 1.

|  | Constitutive Substance | Film Formation Method | Optical Film Thickness |
|---|---|---|---|
| Fifth layer | MgF$_2$ | wet process | 0.3389 |
| Fourth layer | GdF$_3$ | vacuum deposition | 0.5963 |
| Third layer | MgF$_2$ | vacuum deposition | 0.2676 |
| Second layer | GdF$_3$ | vacuum deposition | 0.0955 |
| First layer | MgF$_2$ | vacuum deposition | 0.7007 |
| Substrate | quartz glass | | |

Figure 6:
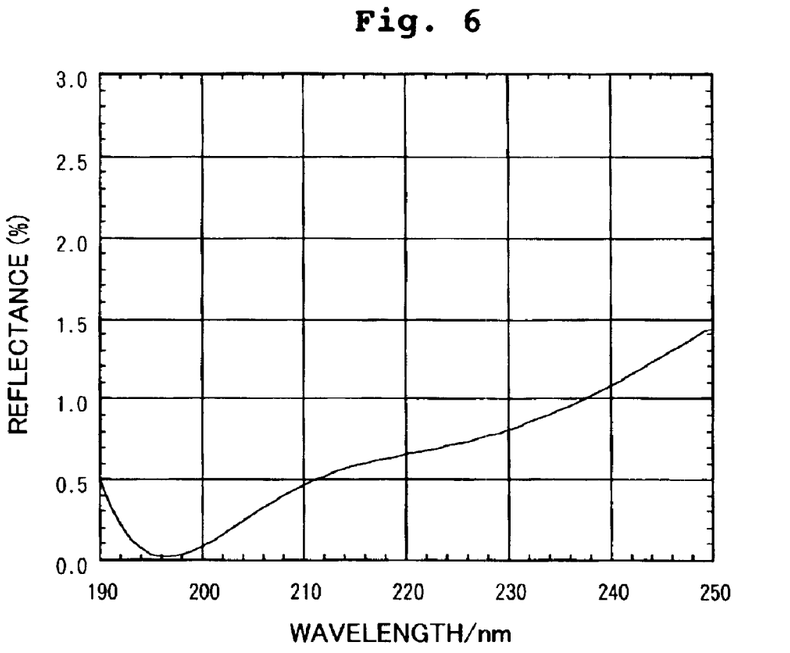
FIG. 6 shows a spectral reflection characteristic of a five-layered antireflection film according to the present invention.
Figure 7:
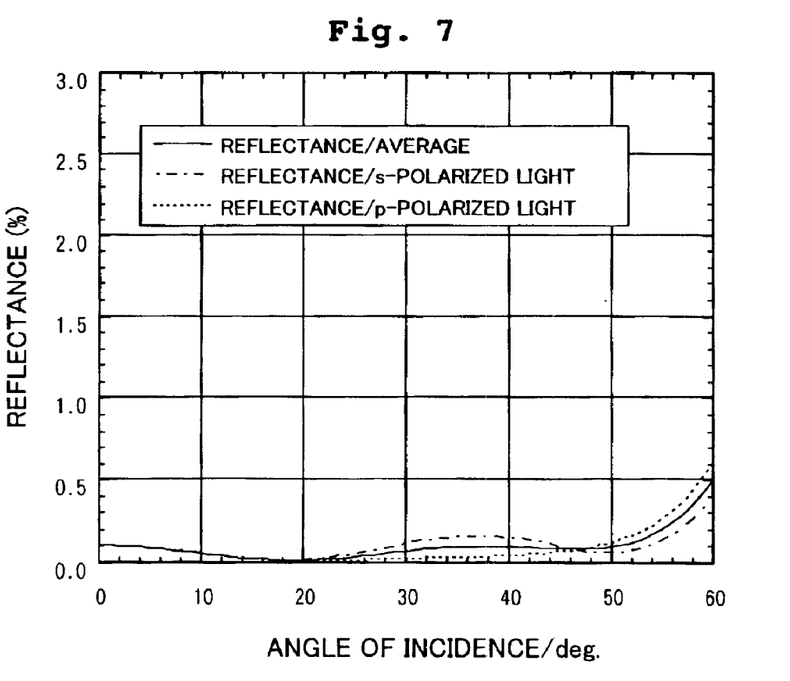
FIG. 7 shows an angular reflection characteristic of the five-layered antireflection film according to the present invention.

The antireflection film was produced as follows. That is, the first to fourth layers were formed by means of the vacuum deposition method. After that, a sol solution having a concentration of 0.933%, which was obtained by autoclave-treating the sol solution of magnesium fluoride prepared in Example 1 at 140° C. at a pressure of 12 kg/cm$^2$, was spin-coated to form the film of the fifth layer at the uppermost layer thereby. FIGS. 6 and 7 show results of the measurement of the spectral reflection characteristic at an angle of incidence of 0° (vertical incidence) and the angular reflection characteristic at a wavelength of 193 nm of the optical element.

COMPARATIVE EXAMPLE 3

Figure 8:
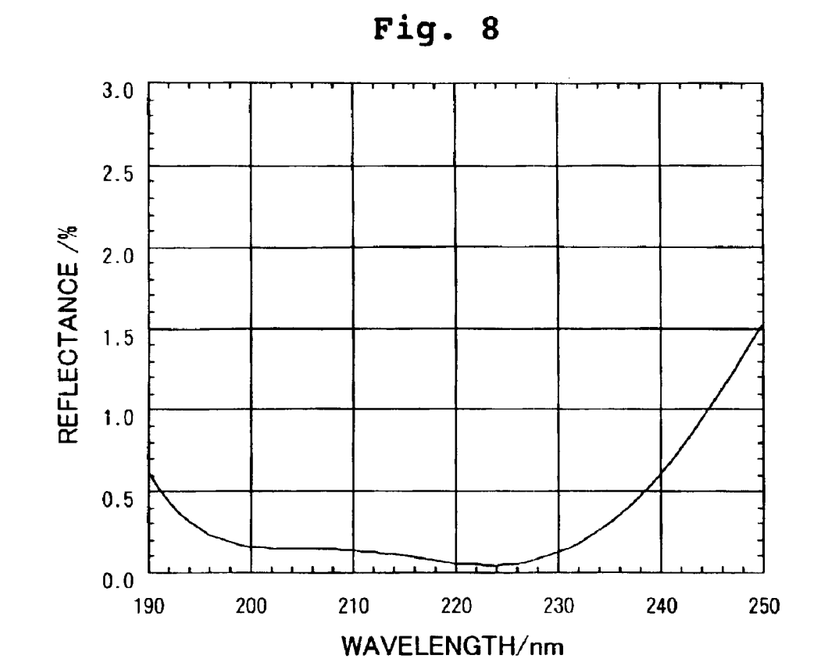
FIG. 8 shows a spectral reflection characteristic of a five-layered antireflection film formed by only the vacuum deposition.
Figure 9:
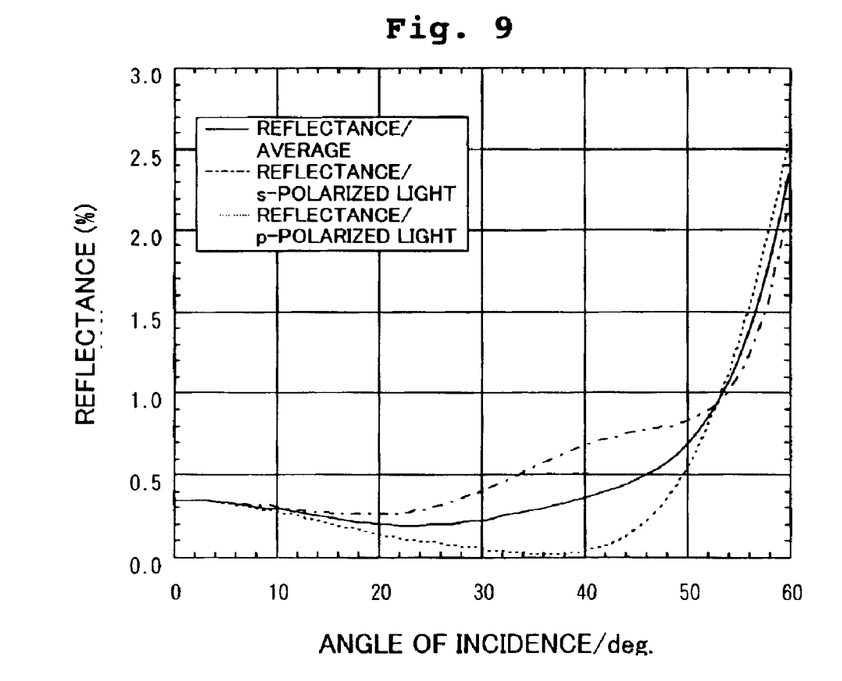
FIG. 9 shows an angular reflection characteristic of the five-layered antireflection film formed by only the vacuum deposition.

A five-layered antireflection film was produced by using only the vacuum deposition method as described in Comparative Example 2. FIGS. 8 and 9 show results of the measurement of the spectral reflection characteristic at an angle of incidence of 0° and the angular reflection characteristic at a wavelength of 193 nm of the film. The design and the film thickness of the film are as follows. Also in Comparative Example 3, the thicknesses of the respective layers were determined so that the angular characteristic was satisfactory at the wavelength of 193 nm.

|  | Constitutive Substance | Film Formation Method | Optical Film Thickness |
|---|---|---|---|
| Fifth layer | MgF$_2$ | vacuum deposition | 0.5874 |
| Fourth layer | GdF$_3$ | vacuum deposition | 0.0218 |
| Third layer | MgF$_2$ | vacuum deposition | 0.4997 |
| Second layer | GdF$_3$ | vacuum deposition | 0.2786 |
| First layer | MgF$_2$ | vacuum deposition | 0.2714 |
| Substrate | quartz glass | | |

When FIG. 7 is compared with FIG. 9, it is appreciated that the five-layered antireflection film, in which the uppermost layer film was formed in accordance with the method of the present invention, has the reflectance which is not more than 0.5% over a range of the angle of incidence of 0° to 58° irrelevant to the direction of polarization, having an extremely wide angular antireflection characteristic. On the other hand, the five-layered antireflection film having all of the layers formed by the vacuum deposition had the following angular antireflection characteristic. That is, according to FIG. 9, the reflectance was not more than 0.5% in a range of the angle of incidence of 0° to 34°, and the reflectance was suddenly raised at not less than 34°. Further, the reflectance in the vicinity of 0° was high, i.e., 0.34%. Furthermore, the difference in angular reflection characteristic was large between the s-polarized light component and the p-polarized light component. As described above, the antireflection film of the present invention is more excellent than the antireflection film produced by only the vacuum deposition method.

Exemplary Application to Exposure Apparatus

Figure 10:
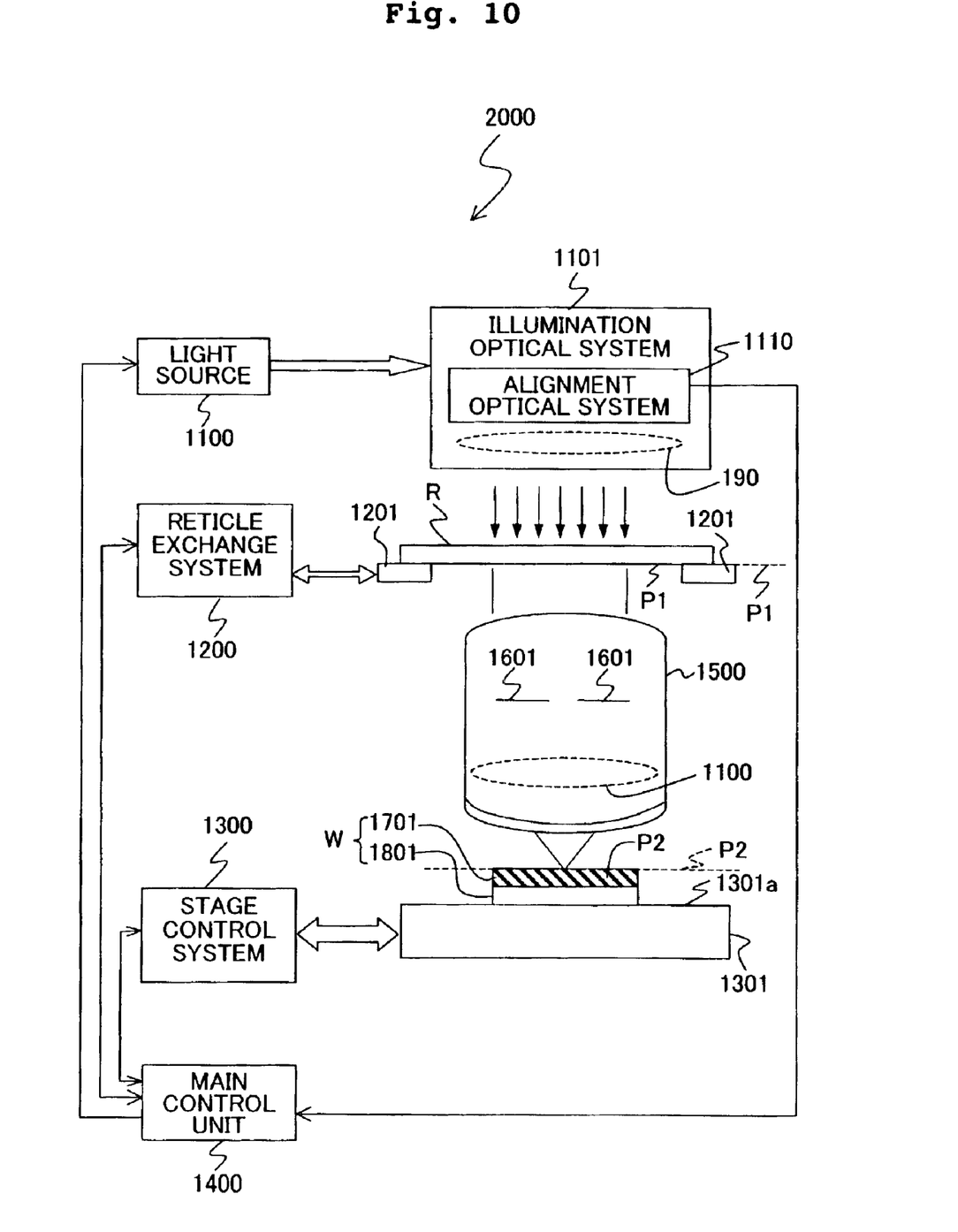
FIG. 10 conceptually shows an exposure apparatus which has an optical element according to the present invention.

Next, an exposure apparatus based on the use of the optical element of the present invention will be explained with reference to FIG. 10 by way of example. FIG. 10 conceptually shows a scanning type projection exposure apparatus 2000 for exposing a wafer 1801 (W as a whole) coated with a photoresist 1701 with an image of a pattern on a reticle R. The optical elements produced in Examples 1 to 7 are applicable to the exposure apparatus.

As shown in FIG. 10, the projection exposure apparatus of the present invention comprises at least a reticle stage 1201 which is movable in the direction parallel to the surface of the reticle R while holding the reticle R (mask), a wafer stage 1301 which is movable in the direction parallel to the wafer surface while holding the wafer (substrate) W on the surface 1301a, an illumination optical system 1101 which radiates the vacuum ultraviolet light beam onto the reticle R (mask), a light source 1100 which supplies the vacuum ultraviolet light beam as an exposure light beam to the illumination optical system 1101, and a projection optical system 1500 which projects the image of the pattern on the reticle R onto the wafer W. The projection optical system 1500 is arranged between the reticle R and the wafer W so that the surface P1, on which the reticle R is arranged, is the object plane, and the surface P2 of the wafer W is the image plane. The illumination optical system 1101 includes an alignment optical system 1110 for adjusting the relative positions of the reticle R and the wafer W. A reticle exchange system 1200 exchanges and transports the reticle R set on the reticle stage 1201. The reticle exchange system 1200 includes a reticle stage driver (not shown) for moving the reticle stage 1201. A stage control system 1300 is provided with a wafer stage driver (not shown) for moving the wafer stage 1301. A main control system 1400 controls the reticle stage driver and the wafer stage driver by the aid of the stage control system 1300 to drive the reticle stage and the wafer stage so that the reticle stage and the wafer stage are moved in synchronization with the exposure light beam. The projection optical system 1500 further comprises an alignment optical system 1601.

The optical element, which is coated with the multilayered film containing the MgF$_2$ film produced in Example described above, can be used for the exposure apparatus 2000. Specifically, the optical element, which was produced in each of Examples 1 to 7, can be used for the optical lens 190 of the illumination optical system 1101 and the projection lens 1100 of the projection optical system 1500. Usually, a plurality of projection lenses 1100 are arranged in the projection optical system 1500. Especially, it is preferable that the lens according to the present invention is used for the lens which is disposed on the light-outgoing side, i.e., at the position nearest to the wafer W. In this arrangement, the multilayered film may be applied to only the light-incoming surface of the projection lens. Alternatively, the multilayered film may be applied to the entire lens. Further, those used as the optical elements in the exposure apparatus include, for example, fly's eye lenses, a variety of relay lenses, beam splitters, condenser lenses, beam expanders, and reflecting mirrors. However, the present invention is applicable to any one of the elements.

Nitrogen gas was introduced into the body tube of the projection optical system 1500 to operate the exposure apparatus of the present invention. The transmittance of the projection lens 1100 was not lowered even after the passage of one year. An inert gas such as argon gas and helium gas may be introduced in place of nitrogen gas. In order to avoid any adsorption of water molecules, it is necessary that the humidity in the body tube is low. It is desirable that the humidity is not more than 10%. It is needless to say that the interior of the body tube may be in vacuum.

FIG. 10 is illustrative of the scanning type projection exposure apparatus. However, there is no limitation thereto. The present invention is also applicable to the projection exposure apparatus based on the step-and-repeat system (so-called stepper), the mirror projection aligner, and the proximity type exposure apparatus. The optical element equipped with a reflecting film produced in Examples 1–7 is applicable, for example, to a reflecting plate used for an exposure apparatus having a projection optical system based on the reflection system or the cata-dioptric system. The projection exposure apparatus and the optical elements used for the same are disclosed, for example, in U.S. Pat. No. 5,835,275. The document is incorporated herein by reference within a range of permission of the domestic laws and ordinances of the designated state. Further, the optical element of the present invention is usable for a variety of apparatuses other than the exposure apparatus, including, for example, spectroscopes, laser repair apparatuses, various inspection apparatuses, and sensors.

According to the wet process of the present invention, the fluoride thin film, which exhibited the low refractive index of 1.10 to 1.30 with respect to the ultraviolet light beam having a wavelength of not more than 300 nm, was successfully formed. Further, the transmission loss, which would be otherwise caused by the absorption and the scattering, was extremely decreased in the same wavelength region. The $MgF_2$ monolayer film formed on the quartz substrate and the antireflection film combined with the vacuum-deposited film exhibited the satisfactory antireflection effect in the ultraviolet region. Therefore, when the present invention is used, then it is possible to further decrease the refractive index of the low refractive index film, and it is possible to increase the difference in refractive index between the high refractive index film and the low refractive index film in the multilayered film. Accordingly, as for the use of the optical element of the present invention in the ultraviolet region of not more than 300 nm, especially in the vacuum ultraviolet region of not more than 250 nm, it is possible to provide the optical element including the antireflection film which has a small number of layers, which has a low reflectance, which has a wide angular characteristic, and which has a small difference in reflectance between p-polarization and s-polarization, and/or the reflection film which has a small number of layers, which has a high reflectance, and which has a wide wavelength region for high reflectance. Further, it is possible to provide the exposure apparatus based on the use of the optical element. Therefore, the present invention is extremely useful especially for the exposure apparatus based on the use of the optical element of $N.A. \geq 0.8$ in order to realize the exposure with a super fine pattern by using the photolithography. Especially, it is possible to decrease the loss of the illuminance of the light source as compared with the conventional exposure apparatus.

We claim:

1. A method for forming an optical thin film, comprising:

a first step of preparing a sol solution containing minute particles dispersed in a dispersion medium;

a second step of performing at least one of heating and pressurization for the sol solution obtained in the first step without gelling the sol solution; and a third step of applying the sol solution obtained by the at least one of heating and pressurization in the second step onto an optical substrate.

2. The method according to claim 1, wherein the sol solution obtained in the first step is brought into a tightly closable vessel, and the sol solution is heated therein in the second step.

3. The method according to claim 2, wherein a temperature in the vessel is adjusted to 100° C. to 300° C., and a pressure in the vessel is adjusted to 1 $kg/cm^2$ to 80 $kg/cm^2$.

4. The method according to claim 1, wherein the minute particles are synthesized in the first step by reacting, in a solvent, a compound of alkaline earth metal with a fluorine compound.

5. The method according to claim 4, further comprising reacting an anion originating from the compound of alkaline earth metal or a compound containing the anion contained in the sol solution with the dispersion medium in the second step.

6. The method according to claim 4, wherein the compound of alkaline earth metal is acetate or alkoxide.

7. The method according to claim 1, wherein the minute particles are composed of magnesium fluoride, and the dispersion medium is composed of methanol.

8. The method according to claim 1, wherein the sol solution is applied onto the optical substrate by a spin coat method or a dip coat method in the third step.

9. The method according to claim 8, further comprising adding, in the third step, an organic solvent having a vapor pressure lower than that of the dispersion medium used in the first step.

10. The method according to claim 9, wherein the organic solvent is one selected from the group consisting of alcohol having not more than 6 carbon atoms, ether, acetal, ketone, ester, phenols, hydrocarbon, halogenated hydrocarbon, and nitrogen compound.

11. The method according to claim 10, wherein the alcohol having not more than 6 carbon atoms is one selected from the group consisting of 1-propanol, 2-propanol, 1-butanol, 2-butanol, tert-butyl alcohol, isobutyl alcohol, 1-pentanol, 2-pentanol, 3-pentanol, 2-methyl-1-butanol, isopentyl alcohol, tert-pentyl alcohol, 3-methyl-2-butanol, and neopentyl alcohol.

12. The method according to claim 1, wherein at least one layer of an optical thin film, which is previously formed by a gas phase method, is provided on the optical substrate.

13. An optical element comprising, on an optical substrate, the optical thin film formed by the method as defined in claim 1.

14. The optical element according to claim 13, wherein a filling rate of the thin film is 37.3% to 65.4%.

* * * * *